(12) United States Patent
Sun et al.

(10) Patent No.: US 11,100,308 B2
(45) Date of Patent: *Aug. 24, 2021

(54) ARRAY SUBSTRATE AND PREPARATION METHOD THEREFOR, FINGERPRINT RECOGNITION METHOD, AND DISPLAY DEVICE

(71) Applicant: BOE Technology Group Co., Ltd., Beijing (CN)

(72) Inventors: Yanliu Sun, Beijing (CN); Shiming Shi, Beijing (CN); Zheng Liu, Beijing (CN); Weifeng Zhou, Beijing (CN)

(73) Assignee: BOE Technology Group Co., Ltd, Beijing (CN)

( * ) Notice: Subject to any disclaimer, the term of this patent is extended or adjusted under 35 U.S.C. 154(b) by 0 days.

This patent is subject to a terminal disclaimer.

(21) Appl. No.: 16/620,983

(22) PCT Filed: Nov. 30, 2018

(86) PCT No.: PCT/CN2018/118681
§ 371 (c)(1),
(2) Date: Dec. 10, 2019

(87) PCT Pub. No.: WO2019/114572
PCT Pub. Date: Jun. 20, 2019

(65) Prior Publication Data
US 2020/0202099 A1    Jun. 25, 2020

(30) Foreign Application Priority Data
Dec. 14, 2017   (CN) .......................... 201711338861.0

(51) Int. Cl.
*G09G 3/20*       (2006.01)
*G06K 9/00*       (2006.01)
(Continued)

(52) U.S. Cl.
CPC ......... *G06K 9/0004* (2013.01); *G06F 3/0412* (2013.01); *H01L 27/14623* (2013.01);
(Continued)

(58) Field of Classification Search
CPC ... G06K 9/0004; G06F 3/0412; G06F 3/0416; G06F 3/0421; H01L 27/14623;
(Continued)

(56) References Cited

U.S. PATENT DOCUMENTS 9,229,289 B2    1/2016 Park et al.
10,365,693 B2 * 7/2019 Sun ..................... G06K 9/0004
(Continued)

FOREIGN PATENT DOCUMENTS

CN    105678255 A    6/2016
CN    106096595 A    11/2016
(Continued)

OTHER PUBLICATIONS

Office Action issued in CN Application No. 201711338861.0 dated Aug. 19, 2019, 27 pages (with English-Translation).
(Continued)

*Primary Examiner* — Lunyi Lao
*Assistant Examiner* — Jarurat Suteerawongsa
(74) *Attorney, Agent, or Firm* — Arent Fox LLP; Michael Fainberg

(57) ABSTRACT

An array substrate and a preparation method therefor, a fingerprint recognition method, and a display device, comprising: a base substrate, a plurality of pixel units and a plurality of fingerprint recognition units located within a display region of the base substrate; a fingerprint recognition unit comprises: a light-shielding layer and a photosensitive image sensor that are located on the base substrate; the light-shielding layer is provided with a through hole which is used to achieve small-aperture imaging; the orthographic
(Continued)

projection of the through hole on the base substrate does not overlap with the orthographic projection of a pixel unit on the base substrate; the photosensitive image sensor is used to receive an image of a fingerprint formed by means of the through hole.

18 Claims, 7 Drawing Sheets

(51) Int. Cl.
  *G06F 3/041* (2006.01)
  *H01L 27/146* (2006.01)
  *H01L 27/32* (2006.01)
  *H01L 51/56* (2006.01)

(52) U.S. Cl.
  CPC .... *H01L 27/14685* (2013.01); *H01L 27/3227* (2013.01); *H01L 51/56* (2013.01)

(58) Field of Classification Search
  CPC ........... H01L 27/14685; H01L 27/3227; H01L 51/56; H01L 27/3234; H01L 27/14636; H01L 27/14625; G09G 3/20; G09G 2360/14; G09G 2360/145; G09G 2354/00; G09G 2300/0439; G01S 17/08; G01S 7/4816; G01S 7/4815; G01S 7/4811
  See application file for complete search history.

(56) References Cited

U.S. PATENT DOCUMENTS

| | | | |
|---|---|---|---|
| 10,564,464 | B2 | 2/2020 | Wang et al. |
| 10,572,711 | B2 | 2/2020 | Li et al. |
| 10,599,939 | B2 | 3/2020 | Gu et al. |
| 10,664,679 | B2 | 5/2020 | Liu et al. |
| 2002/0125437 | A1* | 9/2002 | Izumi ................ H01L 27/12 250/370.01 |
| 2013/0113695 | A1 | 5/2013 | Tseng et al. |
| 2017/0161543 | A1* | 6/2017 | Smith ................ G06K 9/00013 |
| 2018/0005005 | A1* | 1/2018 | He ................ G06K 9/0004 |
| 2018/0089491 | A1* | 3/2018 | Kim ................ G06K 9/00912 |

FOREIGN PATENT DOCUMENTS

| | | |
|---|---|---|
| CN | 106773219 A | 5/2017 |
| CN | 206193837 U | 5/2017 |
| CN | 107103307 A | 8/2017 |
| CN | 107358216 A | 11/2017 |
| CN | 107832749 A | 3/2018 |

OTHER PUBLICATIONS

Office Action issued in CN Application No. 201711338861.0 dated May 11, 2020, 25 pages (with English-Translation).

* cited by examiner

ARRAY SUBSTRATE AND PREPARATION METHOD THEREFOR, FINGERPRINT RECOGNITION METHOD, AND DISPLAY DEVICE

This application is a US National Stage of International Application No. PCT/CN2018/118681, filed Nov. 30, 2018, which claims priority to Chinese Patent Application No. 201711338861.0, filed with Chinese Patent Office on Dec. 14, 2017 and entitled "Array Substrate and Preparation Method Therefor, Fingerprint Recognition Method, and Display Device", the content of which is hereby incorporated by reference in its entirety.

FIELD

The present disclosure relates to the technical field of touch displaying, and particularly relates to an array substrate and a preparation method therefor, a fingerprint recognition method, and a display device.

BACKGROUND

Fingerprints are inborn, unique and unchanging features of a human body, and are different from those of other people. A fingerprint consists of a series of ridges and valleys on a skin surface of a finger tip. Constituting details of these ridges and valleys determine the uniqueness of a fingerprint pattern. A display panel developed therefrom and having a fingerprint recognition function has been used for personal identity verification, which improves the information security of a display device.

At present, a fingerprint recognition region of the display panel having the fingerprint recognition function is arranged in a non-display region of the display panel. Such arrangement enlarges an area of the non-display region of the display panel, which is disadvantageous for the display panel to achieve narrow-bezel displaying.

SUMMARY

An array substrate provided by an embodiment of the present disclosure includes: a base substrate; a plurality of pixel elements and a plurality of fingerprint recognition elements, located within a display region of the base substrate.

The fingerprint recognition elements include: light-shielding layers and photosensitive image sensors, where the light-shielding layers and the photosensitive image sensors are located on the base substrate.

The light-shielding layers are provided with through holes used to achieve small-aperture imaging.

The orthographic projections of the through holes on the base substrate do not overlap with the orthographic projections of the pixel elements on the base substrate.

The photosensitive image sensors are used to receive images of a fingerprint formed by means of the through holes.

Optionally, in the embodiment of the present disclosure, the center distance between two adjacent through holes satisfies a formula:

$$d \geq \frac{3h_d D}{2h_t} + D.$$

d represents the center distance between two adjacent through holes; D represents the diameter of the through holes; $h_d$ represents the distance from the lower surfaces of the light-shielding layers to the upper surfaces of the photosensitive image sensors; and $h_t$ represents the thickness of the light-shielding layers.

Optionally, in the embodiment of the present disclosure, the diameter of the through holes ranges from 5 microns to 20 microns.

Optionally, in the embodiment of the present disclosure, the through holes are arranged on the base substrate in an array manner.

Optionally, in the embodiment of the present disclosure, the orthographic projections of the light-shielding layers on the base substrate cover the orthographic projections of the pixel elements on the base substrate.

Optionally, in the embodiment of the present disclosure, the light-shielding layers are located on the sides, provided with the pixel elements, of the base substrate.

Optionally, in the embodiment of the present disclosure, the light-shielding layers are located between the base substrate and the pixel elements.

Optionally, in the embodiment of the present disclosure, the array substrate further includes: low-temperature dielectric layers located between the light-shielding layers and the pixel elements.

Optionally, in the embodiment of the present disclosure, the array substrate further includes: wires connected with the pixel elements.

The orthographic projections of the through holes on the base substrate do not overlap with the orthographic projections of the wires on the base substrate.

Optionally, in the embodiment of the present disclosure, the base substrate includes at least two flexible layers. The light-shielding layers are arranged between two adjacent flexible layers.

Optionally, in the embodiment of the present disclosure, the photosensitive image sensors are located on the side, back onto the light-shielding layers, of the base substrate and at positions corresponding to the through holes.

Optionally, in the embodiment of the present disclosure, the photosensitive image sensors include Charge-coupled Device (CCD) photosensitive image sensors or Complementary Metal Oxide Semiconductor (CMOS) photosensitive image sensors.

An embodiment of the present disclosure further provides a preparation method for the array substrate provided by the embodiment of the present disclosure, including: forming a plurality of pixel elements and a plurality of fingerprint recognition elements within a display region of a base substrate. The fingerprint recognition elements include: light-shielding layers and photosensitive image sensors, where the light-shielding layers and the photosensitive image sensors are located on the base substrate. The light-shielding layers are provided with through holes used to achieve small-aperture imaging. The orthographic projections of the through holes on the base substrate do not overlap with the orthographic projections of the pixel elements on the base substrate. The photosensitive image sensors are used to receive images of a fingerprint formed by means of the through holes.

Optionally, in the embodiment of the present disclosure, the preparation method specifically includes: forming the light-shielding layers on the base substrate; patterning the light-shielding layers to form the through holes in a region where the fingerprint recognition elements are located; forming the pixel elements on the light-shielding layers with the through holes; and arranging the photosensitive image sensors on the side, back onto the light-shielding layers, of the base substrate and at positions corresponding to the through holes.

An embodiment of the present disclosure further provides a fingerprint recognition method using the array substrate provided by the embodiment of the present disclosure, including: acquiring images formed on the photosensitive image sensors, where the formed images are images formed on the photosensitive image sensors corresponding to the through holes by reflecting, by the fingerprint, light emitted by the pixel elements by means of the through holes; and determining a fingerprint image with a complete fingerprint according to the acquired images formed on the photosensitive image sensors.

An embodiment of the present disclosure further provides a display device, including the array substrate provided by the embodiment of the present disclosure.

DETAILED DESCRIPTION OF THE EMBODIMENTS

Figure 1:
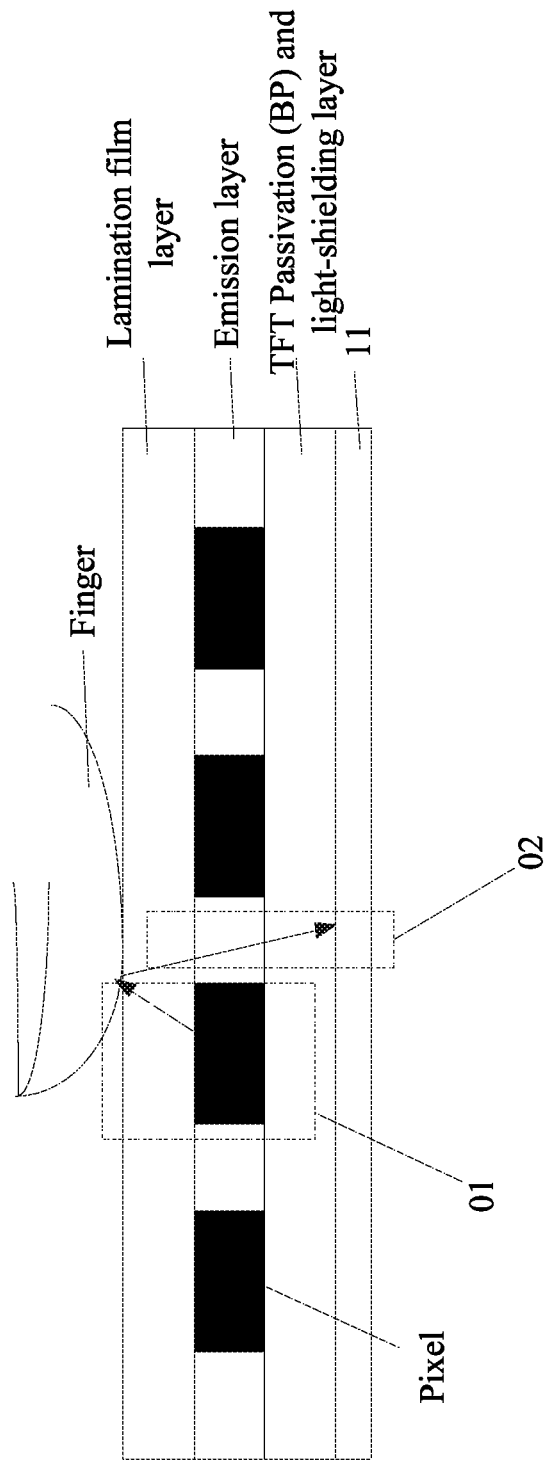
FIG. 1 is a first cross-sectional structural schematic diagram of an array substrate provided by embodiments of the present disclosure.

In order to make objectives, technical solutions and advantages of the present disclosure clearer, the present disclosure is further described below in detail in conjunction with the accompanying drawings. Obviously, the embodiments described are only a part of embodiments of the present disclosure, but not all the embodiments. Furthermore, the embodiments in this application and features in the embodiments may be combined with each other without conflicts. Based on the embodiments in the present disclosure, all other embodiments obtained by those of ordinary skill in the art without creative work shall fall within the protection scope of the present disclosure.

The specific implementation modes of an array substrate and a preparation method therefor, a fingerprint recognition method, and a display device provided by the embodiments of the present disclosure are described below in detail in conjunction with the accompanying drawings. The thicknesses and shapes of all film layers in the drawings do not reflect real scales, and are merely to illustrate the contents of the present disclosure.

Figure 2A:
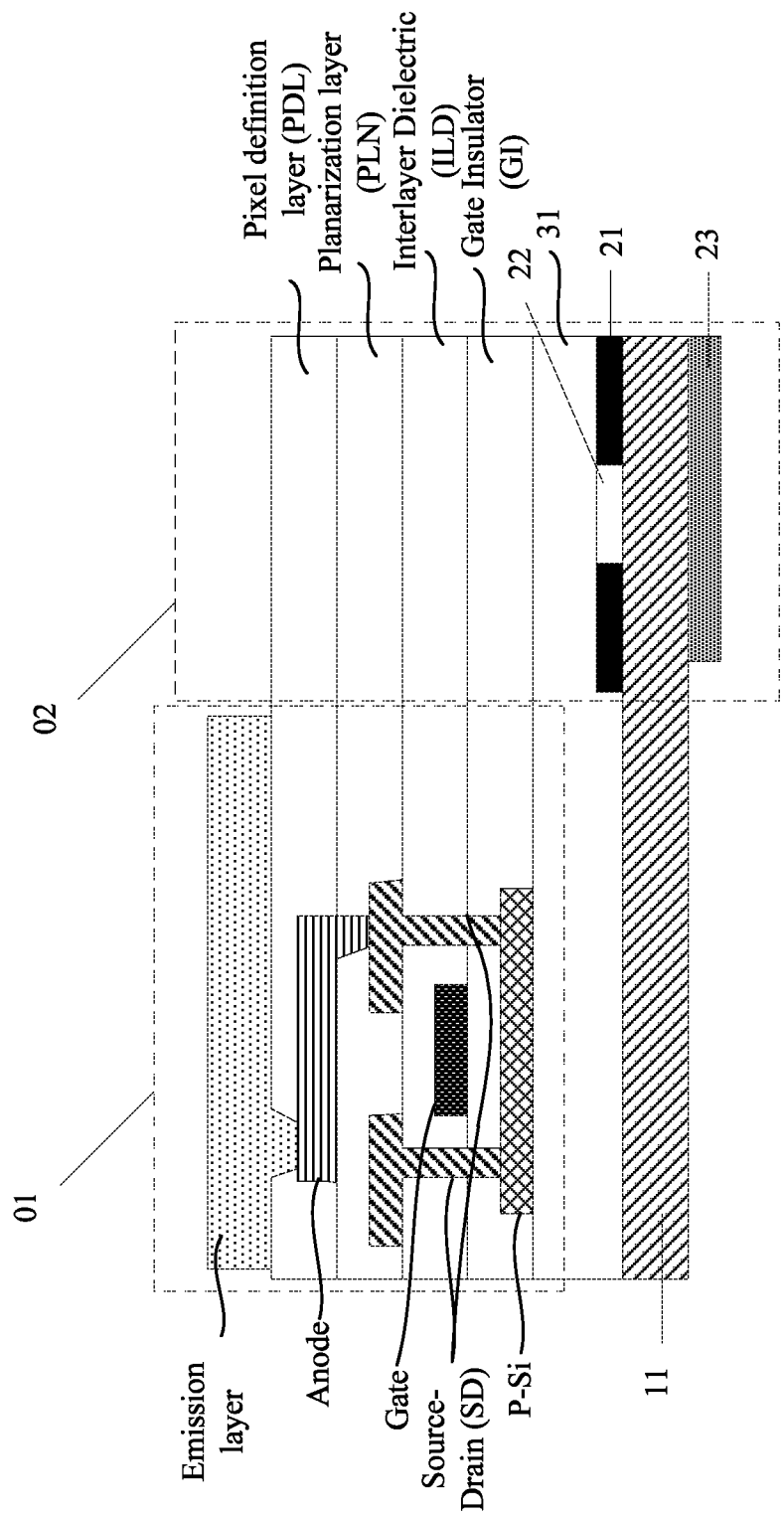
FIG. 2A is a second cross-sectional structural schematic diagram of an array substrate provided by embodiments of the present disclosure.
Figure 2B:
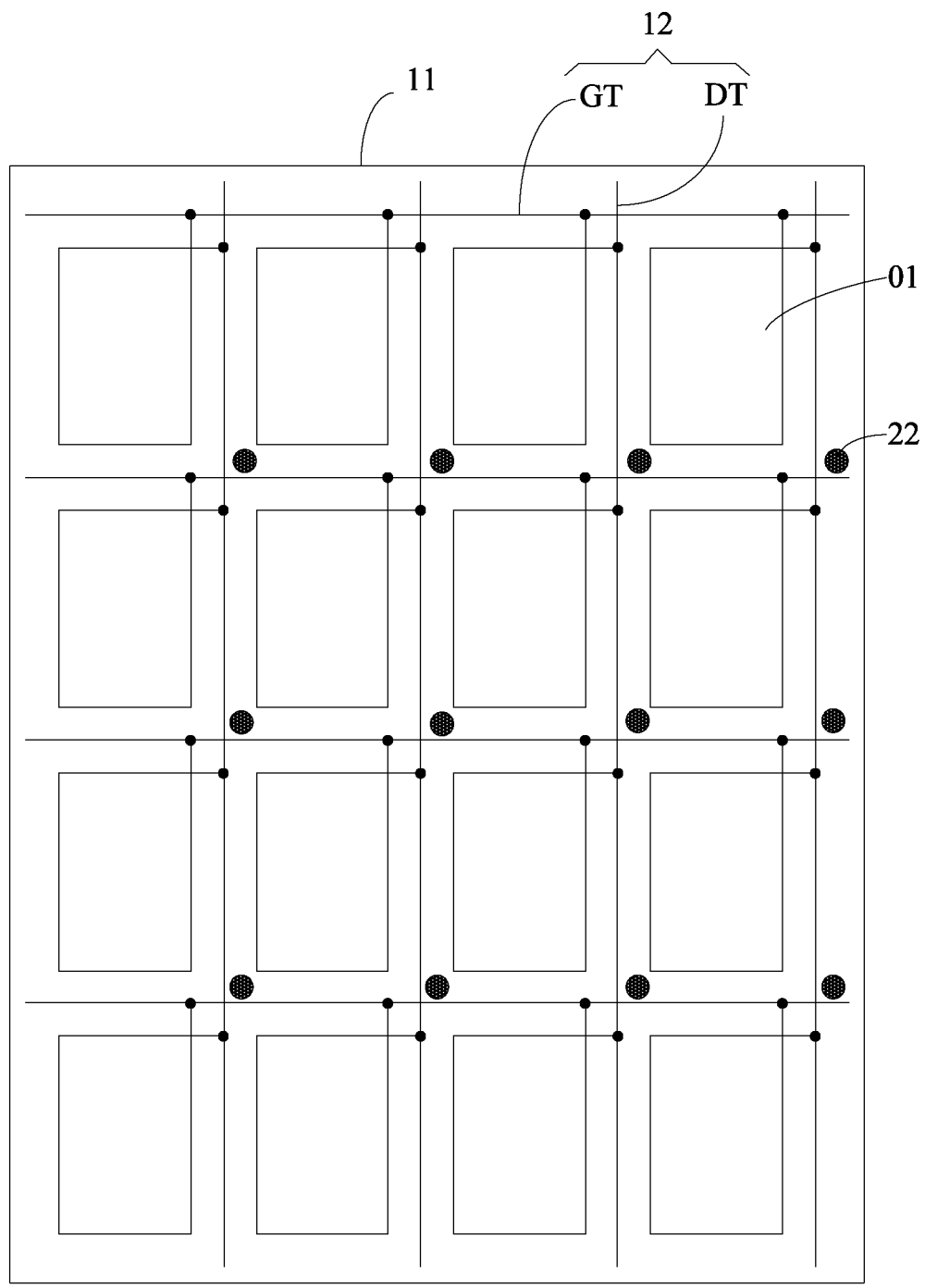
FIG. 2B is a top-view structural schematic diagram of an array substrate provided by embodiments of the present disclosure.

As shown in FIGS. 1, 2A and 2B, the array substrate provided by the embodiment of the present disclosure includes: a base substrate 11, and a plurality of pixel elements 01 and a plurality of fingerprint recognition elements 02 which are located within a display region of the base substrate 11.

The fingerprint recognition elements 02 includes: light-shielding layers 21 and photosensitive image sensors 23 that are located on the base substrate 11.

The light-shielding layers 21 are provided with through holes 22 used to achieve small-aperture imaging. The orthographic projections of the through holes 22 on the base substrate 11 do not overlap with the orthographic projections of the pixel elements 01 on the base substrate 11. Furthermore, the photosensitive image sensors 23 are used to receive images of a fingerprint formed by means of the through holes 22.

According to the array substrate provided by the embodiments of the present disclosure, by arranging the fingerprint recognition elements in the display region of the array substrate, the area of a non-display region of the array substrate may be reduced, which is advantageous for implementing a narrow-bezel design of the array substrate. Furthermore, the orthographic projections of the through holes in the fingerprint recognition elements on the base substrate do not overlap with the orthographic projections of the pixel elements on the base substrate, so that the aperture ratio of the array substrate may not be affected, and various film layers in the pixel elements are prevented from shielding the fingerprint recognition elements. Therefore, the array substrate can achieve a fingerprint recognition function conveniently.

In general, wires used to transmit signals to the pixel elements are arranged in the display region of the array substrate. In specific implementation, as shown in FIG. 2B, the array substrate further includes: wires 12 connected with the pixel elements 01. Since the wires 12 are generally arranged in gaps between adjacent pixel elements 01, in order to prevent the wires 12 from shielding the fingerprint recognition elements, the orthographic projections of the through holes 22 on the base substrate 11 do not overlap with the orthographic projections of the wires 12 on the base substrate 11.

An organic light emitting diode (OLED) has the advantages of low energy consumption, low production cost, autoluminescence, wide viewing angle, fast response and the like. In specific implementation, in the embodiments of the present disclosure, the pixel elements include OLEDs and pixel circuits used to drive the OLEDs to emit light. The above wires are signal lines used to input various signals to the pixel circuits, such as gate lines GT, data lines DT, high-voltage signal lines and reference voltage signal lines, etc.

Specifically, in the above array substrate provided by the embodiments of the present disclosure, during fingerprint recognition, the pixel elements emit light to irradiate fingerprints, and the fingerprints reflect the irradiating light and form images on the photosensitive image sensors by means of the through holes arranged on the light-shielding layers, so that the images formed on the photosensitive image sensors may be acquired, and a fingerprint image with a complete fingerprint may be determined according to the acquired images formed on the photosensitive image sensors, so as to process fingerprint information, thereby achieving fingerprint recognition.

The through holes are manufactured on the light-shielding layers located on the base substrate. In order to avoid the influence on an imaging effect of the through holes, or avoid a situation that the images may not be formed on the photosensitive image sensors, the through holes on the light-shielding layers may be arranged at positions that are not shielded by the pixel elements and the wires connected with the pixel elements.

It shall be noted that the diameter of the through holes shall meet the requirements of a small-aperture imaging principle on a small-aperture diameter. In actual application, the specific size of the diameter of the through holes may be designed and determined according to an actual application environment, and is not specifically limited here.

In order to improve the resolving accuracy of all fingerprint recognition elements for fingerprint recognition, the diameter of the through holes shall be as small as possible, but it may not be too small. An extremely small diameter of the through holes will easily cause extremely low illuminance on the surfaces of the photosensitive image sensors, and it is difficult to extract imaging data. Therefore, in specific implementation, in the above array substrate provided by the embodiment of the present disclosure, the value range of the diameter of each through hole is set to be from 5 microns to 20 microns in combination with the photosensitivity of the photosensitive image sensors according to an actual structure of the array substrate and a film layer stacking mode used.

In specific implementation, in the array substrate, the fingerprint recognition elements may be uniformly located in the whole array substrate, or may be only located in a certain specific region in the array substrate, and this is not specifically limited thereto.

Figure 3:
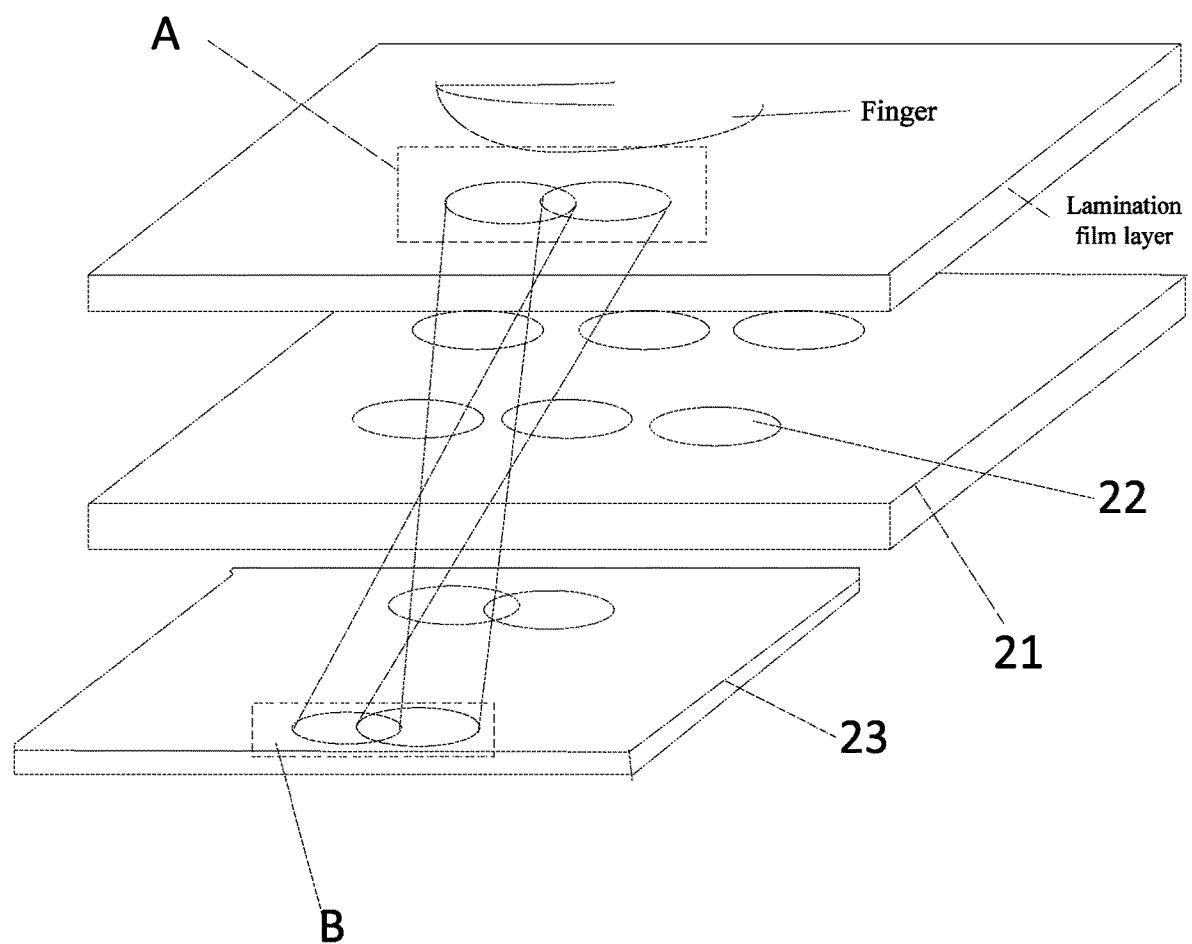
FIG. 3 is a stacked structural schematic diagram of an array substrate provided by embodiments of the present disclosure.
Figure 4:
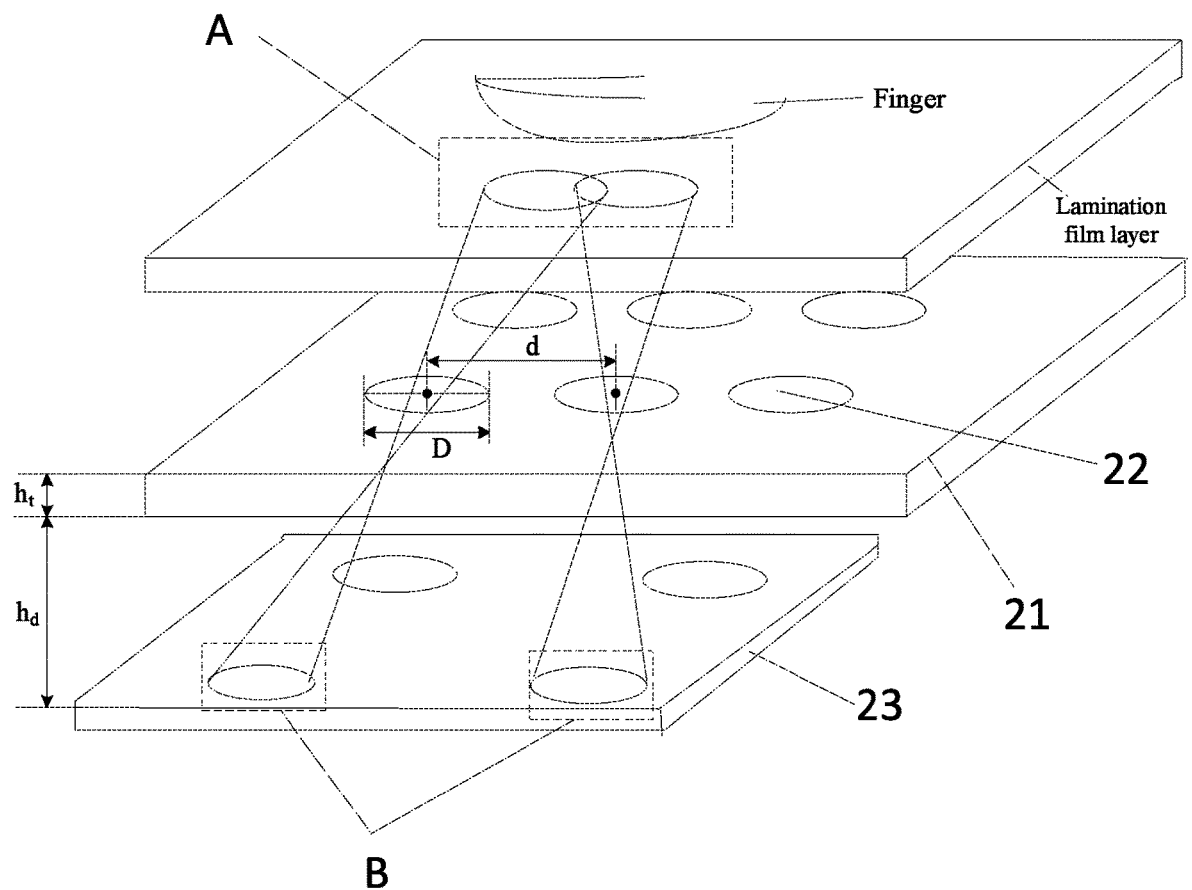
FIG. 4 is a first structural schematic diagram of a fingerprint recognition principle of an array substrate provided by embodiments of the present disclosure.

In specific implementation, the through holes may be uniformly arranged on the base substrate. Generally, during imaging by the small-aperture imaging principle, images formed in the center of a small aperture are relatively clear, and are blurred when being close to the edge, so that the through holes in the fingerprint recognition elements may be arranged in an array manner. In this way, the fingerprint may be partitioned, so that during imaging of the fingerprint, a formed image of each fingerprint recognition element needs to include a formed image of the adjacent fingerprint recognition element. As shown in FIG. 3 and FIG. 4, a fingerprint overlapping region A exists, namely a common imaging portion exists. In this way, the fingerprint images formed by the fingerprint recognition elements are convenient to splice in the later image extraction and processing to be integrated into a complete and clear image.

In specific implementation, the array substrate provided by the embodiments of the present disclosure includes a plurality of fingerprint recognition elements. The various fingerprint recognition elements may be spaced by a certain distance, otherwise the images formed on the photosensitive image sensors by the through holes of the various fingerprint recognition elements may overlap. As shown in FIG. 3, a formed image overlapping region B exists. In this way, the fingerprint images are difficult to separate when the imaging data on the photosensitive image sensors are processed.

In specific implementation, as shown in FIG. 4, during recognition of the fingerprint, in order to enable the fingerprint overlapping region A to exist and the formed image overlapping region B not to exist, that is to say, when a situation that objects overlap, while images do not overlap is met, in the array substrate provided by the embodiments of the present disclosure, the center distance between any two adjacent through holes may be enabled to satisfy a formula:

$$d \geq \frac{3h_d D}{2h_t} + D;$$

where d represents the center distance between two adjacent through holes 22; D represents the diameter of the through holes 22; $h_d$ represents the distance from the lower surfaces of the light-shielding layers 21 to the upper surfaces of the photosensitive image sensors 23; and $h_t$ represents the thickness of the light-shielding layers 21.

In this way, when the center distance between every two adjacent through holes 22 meets the requirement of the above formula, since the center distance between every two adjacent through holes 22 is not too long, the fingerprint overlapping region A may exist, and then the complete and clear image may be obtained by processing the imaging data. Furthermore, there exist certain distance between every two adjacent through holes 22, so that the formed image overlapping region B does not exist in the images formed on the photosensitive image sensors 23, so that the fingerprint is recognized by extracting and processing the formed image data.

It shall be noted that in order to meet the imaging requirements of the photosensitive image sensors, region sizes of the images formed by fingerprint details (such as adjacent ridges and valleys) on the image sensors may correspond to the sizes of at least three pixel elements, so that the fingerprints may be accurately recognized.

Specifically, in the above array substrate provided by the embodiments of the present disclosure, the light-shielding layers may be only located in a region where the fingerprint recognition elements are located, or may be deposited on the whole base substrate, so as to avoid the influence on the display characteristics of the array substrate. This is selected according to a specific use scene, and is not specifically limited here.

Figure 5:
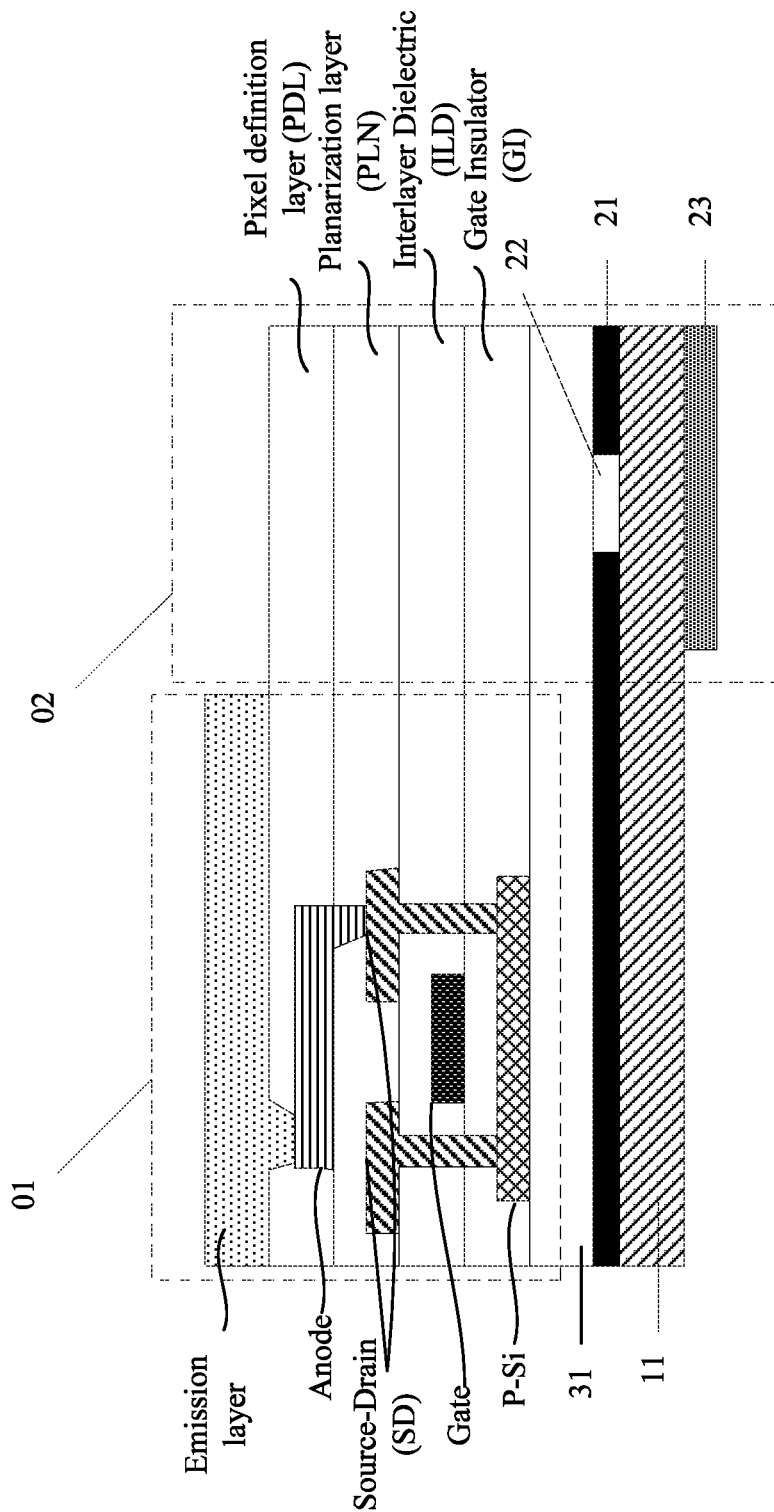
FIG. 5 is a second structural schematic diagram of a fingerprint recognition principle of an array substrate provided by embodiments of the present disclosure.

In specific implementation, in the above array substrate provided by the embodiment of the present disclosure, as shown in FIG. 2A and FIG. 5, the light-shielding layers 21 may be located on the side, provided with the pixel elements 01, of the base substrate 11. Further, in the above array substrate provided by the embodiment of the present disclosure, since the pixel elements include the pixel circuits, the pixel circuits may include thin film transistors, and the OLEDs are located on the sides, away from the base substrate, of the thin film transistors. The light-shielding layers 21 may be located on the side, provided with the thin film transistors, of the base substrate 11.

In specific implementation, as shown in FIG. 2A and FIG. 5, the light-shielding layer 21 may be located between the base substrate 11 and the pixel element 01. Further, in specific implementation, as shown in FIG. 2A, the orthographic projection of the light-shielding layer 21 on the base substrate 11 may be enabled not to overlap with the orthographic projection of the pixel element 01 on the base substrate 11. Or, as shown in FIG. 5, the orthographic projection of the light-shielding layer 21 on the base substrate 11 covers the orthographic projection of the pixel element 01 on the base substrate 11.

In specific implementation, in the above array substrate provided by the embodiments of the present disclosure, a material of the light-shielding layers may include a metal material, or a non-metal material for light shielding. During preparation of the light-shielding layers, the through holes penetrating through the light-shielding layers are manufactured on the light-shielding layers by means of a mask.

In specific implementation, in the above array substrate provided by the embodiments of the present disclosure, as shown in FIG. 5, the array substrate further include: a low-temperature dielectric layer 31 located between the light-shielding layer 21 and the pixel element 01. Further, the low-temperature dielectric layers 31 are located between the thin film transistors and the light-shielding layers 21, so that the influence on a manufacturing process of the thin film transistors in the pixel elements may be avoided. Particularly, when the material of the light-shielding layers is the metal material, the low-temperature dielectric layers 31 may avoid the influence on the manufacturing process of the thin film transistors in the pixel elements.

In specific implementation, in the above array substrate provided by the embodiment of the present disclosure, the array substrate may be a rigid array substrate. When the array substrate is the rigid array substrate, the base substrate may be a glass substrate, a sapphire substrate, a quartz substrate, a plastic substrate and the like.

In specific implementation, in the above array substrate provided by the embodiment of the present disclosure, the array substrate may also be a flexible array substrate. When the array substrate may also be the flexible array substrate, the base substrate may be a flexible substrate, such as a PI substrate. Of course, it may also be other flexible material substrates, and is not limited here.

It shall be noted that when the base substrate is the flexible substrate, it may include a flexible layer, or may include at least two flexible layers. The present disclosure is not limited thereto. When the base substrate includes at least two flexible layers, the light-shielding layers may be arranged between the two flexible layers, so that the low-temperature dielectric layers may not be arranged additionally, which further reduces the thickness of the film layers in the array substrate.

In specific implementation, in the above array substrate provided by the embodiments of the present disclosure, as shown in FIG. 5, the photosensitive image sensor 23 may be located on the side, back onto the light-shielding layer 21, of the base substrate 11 and at a position corresponding to the through hole 22.

Specifically, in the above array substrate provided by the embodiments of the present disclosure, the photosensitive image sensors and the light-shielding layers are respectively located on two sides of the base substrate, and the photosensitive image sensors are located at the positions corresponding to the through holes, so that images can be conveniently formed on the photosensitive image sensors.

It shall be noted that one photosensitive image sensor may be arranged in the array substrate. Images may be formed in all regions of the photosensitive image sensor by all the through holes, and then the images formed in all the regions of the photosensitive image sensor are processed, thereby achieving fingerprint recognition. Of course, a plurality of photosensitive image sensors may also be arranged in the array substrate. The photosensitive image sensors are in one-to-one correspondence to all the through holes, or one photosensitive image sensor corresponds to a plurality of through holes. This is set according to a specific application situation, and is not specifically limited.

In specific implementation, in the above array substrate provided by the embodiment of the present disclosure, the photosensitive image sensors may include CCD photosensitive image sensors or CMOS photosensitive image sensors. Of course, the photosensitive image sensors may also be other photosensitive image sensors capable of recognizing the fingerprints, and are not specifically limited here.

Based on the same inventive concept, an embodiment of the present disclosure further provides a preparation method for an array substrate, including that: a plurality of pixel elements and a plurality of fingerprint recognition elements are formed in a display region of a base substrate. The fingerprint recognition elements include: light-shielding layers and photosensitive image sensors, where the light-shielding layers and the photosensitive image sensors are located on the base substrate. The light-shielding layers are provided with through holes used to achieve small-aperture imaging. The orthographic projections of the through holes on the base substrate do not overlap with the orthographic projections of the pixel elements on the base substrate. The photosensitive image sensors are used to receive images of a fingerprint formed by means of the through holes.

Since the problem solving principle of the preparation method for the array substrate is similar to that of the above-mentioned array substrate, the implementations of the preparation method for the array substrate may refer to the implementations of the above-mentioned array substrate, and repeated descriptions are omitted.

In specific implementation, the light-shielding layers may be arranged between the pixel elements and the base substrate.

Figure 6:
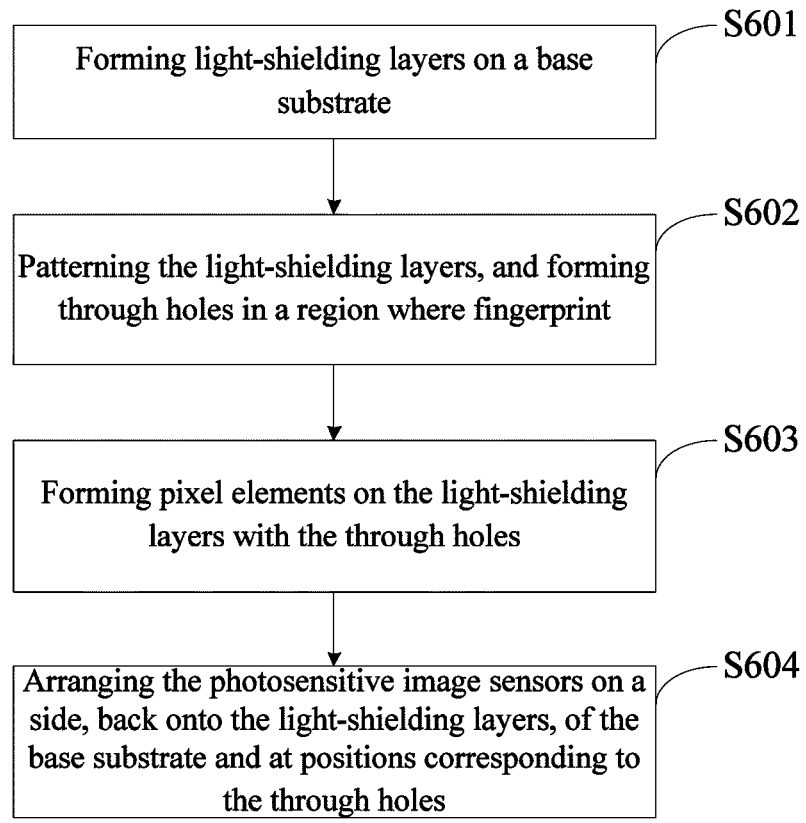
FIG. 6 is a flow diagram of a preparation method for an array substrate provided by embodiments of the present disclosure.

As shown in FIG. 6, the preparation method provided by the embodiments of the present disclosure may specifically include the following steps.

S601, the light-shielding layers are formed on the base substrate.

S602, the light-shielding layers are patterned, and through holes are formed in a region where the fingerprint recognition elements are located. The orthographic projections of the through holes on the base substrate do not overlap with the orthographic projections of the pixel elements on the base substrate.

S603, the pixel elements are formed on the light-shielding layers with the through holes. Of course, Step S603 may further include: wires connected with the pixel elements are formed. The orthographic projections of the through holes on the base substrate do not overlap with the orthographic projections of the wires on the base substrate.

S604, the photosensitive image sensors are arranged on the side, back onto the light-shielding layers, of the base substrate and at positions corresponding to the through holes.

Figure 7:
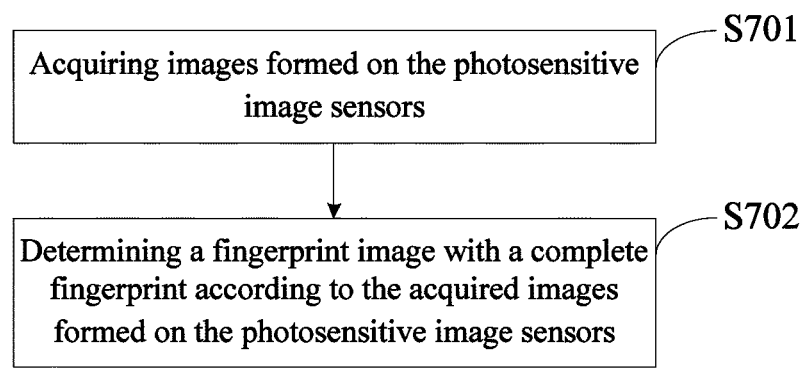
FIG. 7 is a flow diagram of a fingerprint recognition method provided by embodiments of the present disclosure.

Based on the same inventive concept, an embodiment of the present disclosure further provides a fingerprint recognition method using the above array substrate. As shown in FIG. 7, the fingerprint recognition method may include the following steps.

S701, images formed on the photosensitive image sensors are acquired. The formed images are images formed on the photosensitive image sensors corresponding to the through holes by reflecting, by a fingerprint, light emitted by the pixel elements by means of the through holes.

S702, a fingerprint image with a complete fingerprint is determined according to the acquired images formed on the photosensitive image sensors. Specifically, the images formed on the photosensitive image sensors are spliced and integrated to obtain a complete fingerprint image.

Since the problem solving principle of the fingerprint recognition method is similar to that of the above-mentioned array substrate, the implementations of the fingerprint recognition method may refer to the implementations of the above-mentioned array substrate, and repeated descriptions are omitted.

Based on the same inventive concept, an embodiment of the present disclosure further provides a display device, including any one of the above array substrates provided by the embodiments of the present disclosure. The problem solving principle of the display device is similar to that of the above-mentioned array substrate, so that the implementations of the display device may refer to the implementations of the array substrate, and repeated descriptions will be omitted.

In specific implementation, the display device provided by the embodiments of the present disclosure may be: any product or component having a display function, such as a mobile phone, a tablet computer, a television, a display, a notebook computer, a digital photo frame and a navigator, etc. Other indispensable components of the display device are all understood by those skilled in the art, and are not described herein and should not be construed as limiting the present disclosure.

According to the array substrate and the preparation method therefor, the fingerprint recognition method, and the display device, provided by the embodiments of the present disclosure, by arranging the fingerprint recognition elements in the display region of the array substrate, the area of a non-display region of the array substrate may be reduced, which is advantageous for implementing a narrow-bezel design of the array substrate. Furthermore, the orthographic projections of the through holes in the fingerprint recognition elements on the base substrate do not overlap with the orthographic projections of the pixel elements on the base substrate, so that the aperture ratio of the array substrate may not be affected, and various film layers in the pixel elements are also prevented from shielding the fingerprint recognition elements. Therefore, the array substrate can achieve a fingerprint recognition function conveniently.

Obviously, those skilled in the art can make various changes and modifications to the present disclosure without departing from the spirit and scope of the present disclosure. Therefore, if these changes and modifications of the present disclosure fall within the scope of the claims of the present disclosure and equivalent technologies of the present disclosure, the present disclosure is intended to include these changes and modifications.

The invention claimed is:

1. An array substrate, comprising:
a base substrate;
a plurality of pixel elements and a plurality of fingerprint recognition elements, located within a display region of the base substrate, wherein
the fingerprint recognition elements comprise: light-shielding layers and photosensitive image sensors, wherein the light-shielding layers and the photosensitive image sensors are located on the base substrate;
the light-shielding layers are provided with through holes used to achieve small-aperture imaging;
orthographic projections of the through holes on the base substrate do not overlap with orthographic projections of the pixel elements on the base substrate; and
the photosensitive image sensors are used to receive images of a fingerprint formed by the through holes; wherein a center distance between two adjacent through holes satisfies a formula:

$$d \geq \frac{3h_d D}{2h_t} + D;$$

wherein d represents the center distance between two adjacent through holes; D represents diameter of the through holes; ha represents a distance from lower surfaces of the light-shielding layers to upper surfaces of the photosensitive image sensors; and $h_t$ represents thickness of the light-shielding layers.

2. The array substrate according to claim 1, wherein diameter of the through holes ranges from 5 microns to 20 microns.

3. The array substrate according to claim 1, wherein the through holes are arranged on the base substrate in an array manner.

4. The array substrate according to claim 1, wherein orthographic projections of the light-shielding layers on the base substrate cover the orthographic projections of the pixel elements on the base substrate.

5. The array substrate according to claim 1, wherein the light-shielding layers are located on a side, provided with the pixel elements, of the base substrate.

6. The array substrate according to claim 5, wherein the light-shielding layers are located between the base substrate and the pixel elements.

7. The array substrate according to claim 6, wherein the array substrate further comprises: low-temperature dielectric layers located between the light-shielding layers and the pixel elements.

8. The array substrate according to claim 1, wherein the array substrate further comprises: wires connected with the pixel elements; and
the orthographic projections of the through holes on the base substrate do not overlap with orthographic projections of the wires on the base substrate.

9. The array substrate according to claim 1, wherein the base substrate comprises at least two flexible layers, and the light-shielding layers are arranged between two adjacent flexible layers.

10. The array substrate according to claim 1, wherein the photosensitive image sensors are located on a side, back onto the light-shielding layers, of the base substrate and at positions corresponding to the through holes.

11. The array substrate according to claim 10, wherein the photosensitive image sensors comprise Charge-coupled Device (CCD) photosensitive image sensors or Complementary Metal Oxide Semiconductor (CMOS) photosensitive image sensors.

12. A fingerprint recognition method using an array substrate according to claim 1, comprising:
acquiring images formed on the photosensitive image sensors, wherein the formed images are images formed on the photosensitive image sensors corresponding to the through holes by reflecting, by a fingerprint, light emitted by the pixel elements by the through holes; and
determining a fingerprint image with a complete fingerprint according to the acquired images formed on the photosensitive image sensors.

13. A preparation method for an array substrate, comprising:
forming a plurality of pixel elements and a plurality of fingerprint recognition elements within a display region of a base substrate; wherein
the fingerprint recognition elements comprise: light-shielding layers and photosensitive image sensors, wherein the light-shielding layers and the photosensitive image sensors are located on the base substrate;

the light-shielding layers are provided with through holes which are used to achieve small-aperture imaging; orthographic projections of the through holes on the base substrate do not overlap with orthographic projections of the pixel elements on the base substrate; and the photosensitive image sensors are used to receive images of a fingerprint formed by the through holes;

wherein a center distance between two adjacent through holes satisfies a formula:

$$d \geq \frac{3h_d D}{2h_t} + D;$$

wherein d represents the center distance between two adjacent through holes; D represents diameter of the through holes; ha represents a distance from lower surfaces of the light-shielding layers to upper surfaces of the photosensitive image sensors; and $h_t$ represents thickness of the light-shielding layers.

14. The preparation method according to claim 13, wherein the preparation method further comprises:
forming the light-shielding layers on the base substrate;
patterning the light-shielding layers, and forming the through holes in a region where the fingerprint recognition elements are located;
forming the pixel elements on the light-shielding layers with the through holes; and
arranging the photosensitive image sensors on a side, back onto the light-shielding layers, of the base substrate and at positions corresponding to the through holes.

15. A display device, comprising: an array substrate comprising:
a base substrate;
a plurality of pixel elements and a plurality of fingerprint recognition elements, located within a display region of the base substrate, wherein
the fingerprint recognition elements comprise: light-shielding layers and photosensitive image sensors, wherein the light-shielding layers and the photosensitive image sensors are located on the base substrate;
the light-shielding layers are provided with through holes used to achieve small-aperture imaging;
orthographic projections of the through holes on the base substrate do not overlap with orthographic projections of the pixel elements on the base substrate; and
the photosensitive image sensors are used to receive images of a fingerprint formed by the through holes;
wherein a center distance between two adjacent through holes satisfies a formula:

$$d \geq \frac{3h_d D}{2h_t} + D;$$

wherein d represents the center distance between two adjacent through holes; D represents diameter of the through holes; ha represents a distance from lower surfaces of the light-shielding layers to upper surfaces of the photosensitive image sensors; and $h_t$ represents thickness of the light-shielding layers.

16. The display device according to claim 15, wherein diameter of the through holes ranges from 5 microns to 20 microns.

17. The display device according to claim 15, wherein the through holes are arranged on the base substrate in an array manner.

18. The display device according to claim 15, wherein orthographic projections of the light-shielding layers on the base substrate cover the orthographic projections of the pixel elements on the base substrate.

* * * * *